United States Patent
Tsuda et al.

(10) Patent No.: US 8,053,254 B2
(45) Date of Patent: Nov. 8, 2011

(54) APPARATUS FOR FORMING THIN FILM AND METHOD OF MANUFACTURING SEMICONDUCTOR FILM

(75) Inventors: Mutsumi Tsuda, Tokyo (JP); Masakazu Taki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/994,343

(22) PCT Filed: May 14, 2009

(86) PCT No.: PCT/JP2009/059004
§ 371 (c)(1),
(2), (4) Date: Nov. 23, 2010

(87) PCT Pub. No.: WO2009/145068
PCT Pub. Date: Dec. 3, 2009

(65) Prior Publication Data
US 2011/0097823 A1    Apr. 28, 2011

(30) Foreign Application Priority Data

May 26, 2008 (JP) ................................ 2008-137281

(51) Int. Cl.
*H01L 21/00* (2006.01)
(52) U.S. Cl. ........................................ 438/5; 118/723 R
(58) Field of Classification Search ................ 438/5, 97; 118/723 R; 427/569
See application file for complete search history.

(56) References Cited

U.S. PATENT DOCUMENTS

| | | | | |
|---|---|---|---|---|
| 5,956,602 A | * | 9/1999 | Ishihara ......................... | 438/491 |
| 2009/0090616 A1 | * | 4/2009 | Du et al. ................... | 204/192.13 |

FOREIGN PATENT DOCUMENTS

| | | |
|---|---|---|
| JP | 4 372118 | 12/1992 |
| JP | 5 166733 | 7/1993 |
| JP | 8 250433 | 9/1996 |
| JP | 9 508236 | 8/1997 |
| JP | 2000 306884 | 11/2000 |
| JP | 2001 237187 | 8/2001 |
| JP | 2004 146691 | 5/2004 |
| JP | 2006 225763 | 8/2006 |
| JP | 2006 295060 | 10/2006 |

OTHER PUBLICATIONS

International Search Report issued Aug. 4, 2009 in PCT/JP09/59004 filed May 14, 2009.
Layadi, N. et al., "Real-time spectroscopic ellipsometry study of the growth of amorphous and microcrystalline silicon thin films prepared by alternating silicon deposition and hydrogen plasma treatment", Physical Review B, vol. 52, No. 7, pp. 5136-5143, (Aug. 15, 1995).

* cited by examiner

*Primary Examiner* — Ha Tran T Nguyen
*Assistant Examiner* — Shaun Campbell
(74) *Attorney, Agent, or Firm* — Oblon, Spivak, McClelland, Maier & Neustadt, L.L.P.

(57) ABSTRACT

An apparatus including a vacuum chamber having a substrate holding unit that holds a substrate and a plasma electrode facing the substrate, a first gas supply unit that supplies a $H_2$ gas to the vacuum chamber at a constant flow rate, a second gas supply unit that opens or closes a valve to turn on or off the supply of a $SiH_4$ gas, a high-frequency power source that applies a high frequency voltage to the plasma electrode, a shield box that is connected to a ground so as to surround the plasma electrode outside the vacuum chamber, and a control unit that controls the valve such that the $SiH_4$ gas is periodically supplied to the vacuum chamber and modulates the amplitude of high frequency power in synchronization with the opening or closing of the valve, and the valve is provided in the shield box.

6 Claims, 4 Drawing Sheets

APPARATUS FOR FORMING THIN FILM AND METHOD OF MANUFACTURING SEMICONDUCTOR FILM

TECHNICAL FIELD

The present invention relates to a thin film forming apparatus for forming a semiconductor film, such as a microcrystalline silicon thin film used for a silicon thin film solar cell, and a method of manufacturing a semiconductor film.

BACKGROUND ART

An intrinsic (i-type) microcrystalline silicon thin film has been widely used as a photoelectric conversion layer of a silicon thin film solar cell. As a method of manufacturing a microcrystalline silicon thin film, it is general to perform deposition on a substrate by a plasma-enhanced chemical vapor deposition (CVD) method using a mixed gas of silane ($SiH_4$) and hydrogen ($H_2$).

In general, a film forming method called a "high-pressure depletion method" has been widely used to deposit the microcrystalline silicon thin film through the plasma CVD method (for example, see Patent Document 1). Specifically, in a high pressure atmosphere, a $SiH_4$ gas flow rate $[SiH_4]$ is sufficiently reduced (that is, a $H_2$ gas flow rate $[H_2]$ is sufficiently increased), the flow rate ratio of $SiH_4$ "$[SiH_4]/([SiH_4]+[H_2])$" is reduced to about 1% to 5%, and $SiH_4$ in plasma is depleted. In this way, it is possible to deposit the microcrystalline silicon thin film (conversely, when the flow rate ratio of $SiH_4$ is high, an amorphous film is deposited). The microcrystalline silicon thin film thus obtained by this method is applied to a photoelectric conversion layer of a solar cell to manufacture a solar cell sample, and the solar cell sample is evaluated. As a result, practical characteristics, such as a photoelectric conversion efficiency of up to about 9%, are obtained.

As another method of forming the microcrystalline silicon thin film, a film forming method called a layer-by-layer method has been known (for example, see Non-patent Literature 1). In the layer-by-layer method, a plasma CVD apparatus is used to alternately repeat a process of generating $SiH_4$ plasma in the range of 10 s to 100 s and a process of generating $H_2$ plasma in the range of 100 s to 600 s plural times to thereby deposit a silicon thin film. Then, the thin film, which is an amorphous state when it is deposited, is continuously exposed to $H_2$ plasma such that it is crystallized.

In recent years, a large substrate with a size of 1 m×1 m or more has been used in order to put a silicon thin film solar cell to practical use and manufacture a solar cell with high productivity and at a low cost. In the formation of the microcrystalline silicon thin film, not only the deposition rate and the quality of a film, but also a large-scale uniform film forming technique for uniformly forming a thin film on a large meter (m)-size substrate become important.

PRIOR ART DOCUMENTS

Patent Documents

Patent Document 1: Japanese Patent Application No. 2001-237187

Non-Patent Literatures

Non-patent Literature 1: N. Layadi, P. R. Cabarrocas, B. Drevillon, I. Solomon, "Real-time spectroscopic ellipsometry study of the growth of amorphous and microcrystalline silicon thin films prepared by alternating silicon deposition and hydrogen plasma treatment," Phys. Rev. B, vol. 52, pp. 5136-5143 (1995)

DISCLOSURE OF INVENTION

Problem to be Solved by the Invention

Since the i-type microcrystalline silicon thin film has a relatively low light absorption, it is necessary to increase the thickness of the film to at least 2 μm or more. In the method of depositing the microcrystalline silicon thin film using the plasma CVD method disclosed in Patent Document 1, the flow ratio of $SiH_4$, that is, "$[SiH_4]/([SiH_4]+[H_2])$" is adjusted to control crystallinity. Therefore, there is a trade-off relationship between the crystallinity and the deposition rate of the film. That is, in the case of an amorphous film, a high deposition rate is easily obtained. However, when the flow ratio of $SiH_4$ is reduced for crystallization, there is a problem in that the deposition rate is significantly reduced to about 1 nm/s. For example, a process time of 40 minutes or more is required to deposit a microcrystalline silicon thin film with a thickness of 2.5 μm.

In the method of forming the microcrystalline silicon thin film using the layer-by-layer method disclosed in Non-patent Literature 1, when switching between a $SiH_4$ gas used at the time of generating $SiH_4$ plasma and a $H_2$ gas used at the time of generating $H_2$ plasma, the exhaust time is required to exhaust the amount of gas remaining in the supply pipe, thus the net deposition rate is reduced. Non-patent Literature 1 discloses a deposition rate of 0.03 nm/s to 0.06 nm/s as the deposition rate of the microcrystalline silicon thin film in the layer-by-layer method. As such, since the deposition rate is low, it is difficult to improve the throughput of a process of manufacturing a solar cell including a microcrystalline silicon thin film and thus to reduce a manufacturing cost.

In the method of forming the microcrystalline silicon thin film disclosed in Patent Document 1 or Non-patent Document 1, a technique for uniformly forming a microcrystalline silicon thin film on a large substrate with a size of, for example, 1.4 m×1.1 m is not considered.

The invention has been made in order to solve the above-mentioned problems and an object of the invention is to provide an apparatus for forming a thin film and a method of manufacturing a semiconductor film capable of improving the deposition rate while maintaining crystallinity when a semiconductor film, such as a microcrystalline silicon thin film, is deposited.

In addition, an object of the invention is to provide an apparatus for forming a thin film and a method of manufacturing a semiconductor film capable of uniformly depositing a semiconductor film, such as a microcrystalline silicon thin film, at a high speed, on a large meter-size substrate that is necessary to improve the productivity of a thin film solar cell or reduce manufacturing costs.

Means for Solving Problem

An apparatus for forming a thin film according to an aspect of the invention includes: a vacuum chamber including a substrate holding unit that holds a substrate and a plasma electrode that is provided so as to face the substrate; a first gas supply unit that continuously supplies a gas containing hydrogen as a main component to the vacuum chamber during deposition; a second gas supply unit that opens or closes a valve to turn on or off the supply of a material gas containing at least one of silicon and germanium to the vacuum chamber during deposition; a high-frequency power source that applies a high frequency voltage to the plasma electrode; a shield box that is connected to a ground so as to surround the plasma electrode outside the vacuum chamber; and a control unit that controls opening or closing of the valve such that the material gas is periodically supplied to the vacuum chamber, and modulates an amplitude of high frequency power supplied to the plasma electrode in synchronization with the opening or closing of the valve, wherein the valve is provided in the shield box.

Effect of the Invention

According to the invention, when mixed plasma of $SiH_4$ and $H_2$ is used to deposit a microcrystalline silicon thin film on a substrate, it is possible to perform modulation on time of the supply of a $SiH_4$ gas or time of the supply of high frequency power at a high speed. Therefore, it is possible to form a microcrystalline silicon thin film even under the conditions of a high $SiH_4$ flow ratio where only an amorphous silicon film is obtained by the method according to the related art. As a result, it is possible to improve the throughput of a process of manufacturing a solar cell using a microcrystalline silicon thin film as a photoelectric conversion layer.

BEST MODE(S) FOR CARRYING OUT THE INVENTION

Hereinafter, a thin film forming apparatus and a method of manufacturing a semiconductor film according to exemplary embodiments of the invention will be described in detail with reference to the accompanying drawings. However, the invention is not limited to the embodiments.

First Embodiment

Figure 1:
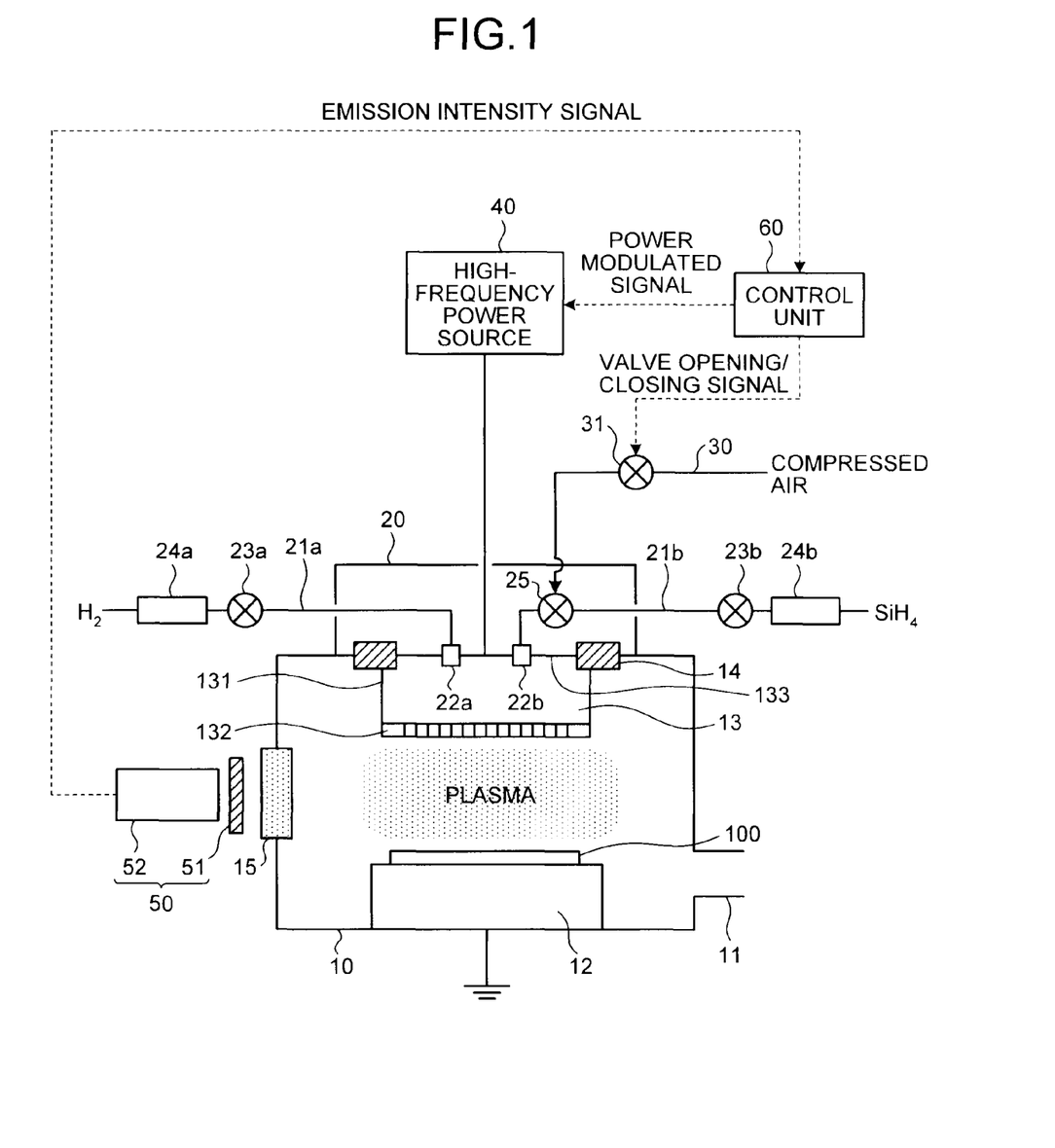
FIG. 1 is a diagram schematically illustrating an example of a structure of a thin film forming apparatus according to a first embodiment of the invention.

FIG. 1 is a diagram schematically illustrating an example of a structure of a thin film forming apparatus according to a first embodiment of the invention. The thin film forming apparatus is based on a plasma CVD apparatus according to the related art, and includes a substrate stage 12 and a plasma electrode 13 in a vacuum chamber 10 that contains an atmosphere for forming a thin film inside thereof. The plasma electrode 13 and a surface of the substrate stage 12 facing the plasma electrode 13 are arranged in parallel to each other. A gas exhaust pipe 11 is provided in the vacuum chamber 10, and gas in the vacuum chamber 10 is exhausted by a vacuum pump (not shown) connected to the gas exhaust pipe 11 such that the inside of the vacuum chamber 10 is set to a predetermined degree of vacuum.

The substrate stage 12 is electrically connected to the ground and a substrate 100, which is to be subjected to a deposition process, is mounted on the substrate stage 12. A heater is provided in the substrate stage 12 and a substrate temperature is set to a predetermined value, for example, about 150° C. to 250° C. during the deposition process. The substrate stage 12 is provided at a lower part of the vacuum chamber 10. The substrate stage 12 corresponds to a substrate holding unit in the claims.

The plasma electrode 13 includes a cylindrical side portion 131, an upper surface portion 133, which is one end of a cylindrical structure, and the bottom which is opposite to the upper surface portion 133. A gas shower head 132 having a plurality of through holes formed therein is provided in the bottom. In addition, the plasma electrode 13 is fixed in the vacuum chamber 10 such that the gas shower head 132 is parallel to a substrate mounting surface of the substrate stage 12 and is spaced at a predetermined distance from the substrate mounting surface of the substrate stage 12. In this embodiment, the plasma electrode 13 is fixed to the vacuum chamber 10 such that the cylindrical side portion 131 or the upper surface portion 133 is electrically insulated from the vacuum chamber 10 by insulating spacers 14 made of, for example, alumina or Teflon (registered trademark).

The cylindrical upper surface portion 133 of the plasma electrode 13 is electrically connected to a high-frequency power source 40 via a shield box 20 that is provided so as to correspond to the position of the plasma electrode 13 and an impedance matching box (not shown). In this way, a high frequency voltage is applied to the plasma electrode 13. In general, the oscillating frequency of the high-frequency power source 40 is 13.56 MHz or 27.12 MHz. However, in some cases, a frequency in the range of 30 MHz to 150 MHz, that is, a VHF (Very High Frequency) band is used in order to increase the density of plasma and increase the deposition rate. As such, since a high frequency voltage is applied to the plasma electrode 13, the shield box 20 is connected to the ground at the outside of the vacuum chamber 10 so as to surround the plasma electrode 13, in order to prevent the radiation or leakage of a high frequency.

A $H_2$ gas supply port 22a for supplying a $H_2$ gas and a $SiH_4$ gas supply port 22b for supplying a $SiH_4$ gas are separately provided in the upper surface portion 133 of the plasma electrode 13, and are connected to a $H_2$ gas supply pipe 21a for supplying the $H_2$ gas and a $SiH_4$ gas supply pipe 21b for supplying the $SiH_4$ gas, respectively. When plasma is generated, a high frequency voltage and a DC self-bias voltage are simultaneously applied to the upper surface portion 133 of the plasma electrode 13. Therefore, when the gas supply pipes 21a and 21b are made of metal (for example, SUS), the plasma electrode 13 and the gas supply pipes 21a and 21b are electrically insulated from each other. Therefore, gas supply ports that form a gas flow path in an insulator block made of, for example, alumina or Teflon (registered trademark) are used as the gas supply port 22a or 22b. An air-driven-type or electromagnetic gas valve 23a that turns on or off the flow of a $H_2$ gas from a $H_2$ gas supply portion (not shown) for supplying the $H_2$ gas, and a mass flow controller 24a that controls the flow rate of the $H_2$ gas are provided on the $H_2$ gas supply pipe 21a. The gas valve 23a is arranged outside the shield box 20.

An air-driven-type or electromagnetic gas valve 23b that turns on or off the flow of a $SiH_4$ gas from a $SiH_4$ gas supply portion (not shown) for supplying the $SiH_4$ gas, a mass flow controller 24b that controls the flow rate of the $SiH_4$ gas, and an air-driven-type gas valve 25 that turns on or off the supply of the $SiH_4$ gas to the vacuum chamber 10 during the formation of a thin film are provided on the SiH$_4$ gas supply pipe 21b. The gas valve 23b is arranged outside the shield box 20, and the air-driven-type gas valve 25 is arranged close to the SiH$_4$ gas supply port 22b in the shield box 20. The gas valve 25 is an air driven type, and an air supply pipe 30 that supplies compressed air to the gas valve 25 is provided. An electromagnetic gas valve 31 that turns on or off the supply of the compressed air is provided on the air supply pipe 30 outside the shield box 20.

When the gas valve 31 is opened or closed, the supply of the compressed air to the gas valve 25 is turned on or off. When the gas valve 31 is turned on to be an open state and the compressed air is supplied to the gas valve 25, the gas valve 25 is turned on (opened) and it is possible to supply the SiH$_4$ gas flowing through the SiH$_4$ gas supply pipe 21b into the vacuum chamber 10. When the gas valve 31 is turned off to be a close state and the supply of the compressed air to the gas valve 25 is cut off, the gas valve 25 is turned off (closed) and the supply of the SiH$_4$ gas flowing through the SiH$_4$ gas supply pipe 21b into the vacuum chamber 10 is cut off. As such, since the gas valve 25 is opened or closed by the compressed air, it may be possible to rapidly supply the SiH$_4$ gas into the vacuum chamber 10 or cut off the supply of the SiH$_4$ gas. In order to turn on or off the supply of the SiH$_4$ gas as rapidly as possible, it is apparent that the pipe distance between the gas valve 25 and the plasma electrode 13 is preferably as short as possible, for example, 10 cm, 5 cm, . . . . In addition, it is preferable that the response speed of the gas valve 25 be as quick as possible. For example, the response time, which is from the supply of the compressed air to the event that the gas valve 25 is switched from the closed state to opening state, is preferably equal to or less than 10 ms (milliseconds). In addition, the response time from a closed state to an opened state according to a valve opening/closing signal is preferably equal to or less than 30 ms and more preferably, equal to or less than 15 ms.

Since a high frequency voltage is applied to the plasma electrode 13 during the formation of a thin film, a high frequency is radiated in the shield box 20. Therefore, the high frequency voltage is also applied to a metal portion of the gas valve 25. However, since the gas valve 25 is an air driven type with no electromagnetic operation, it is possible to prevent an error in the operation of the gas valve 25 or a damage to the gas valve 25. In addition, the supply of the compressed air for driving the gas valve 25 is rapidly performed by the electromagnetic gas valve 31 that is provided outside the shield box 20.

In the first embodiment, the insulating gas supply port 22b is used to electrically insulate the gas valve 25 from the plasma electrode 13. However, the gas valve 25 is not necessarily insulated from the plasma electrode 13. For example, the air-driven-type gas valve 25 may be directly attached to the upper surface portion 133 of the plasma electrode 13. In this case, there is no problem in the opening/closing operation of the gas valve 25, and it is possible to rapidly turn on or off the supply of the SiH$_4$ gas into the vacuum chamber 10. However, in this case, it is necessary to provide, for example, an insulating pipe in the middle of the SiH$_4$ gas pipe 21b in order for electrical insulation.

In the first embodiment, the air-driven-type valve is given as a representative example of a gas valve that is mechanically opened or closed. However, the gas valve is not limited to the air driven type. For example, a piezoelectric valve that is electrically opened or closed may be used as long as it has a sufficient electromagnetic shielding property.

An optical window 15 that enables observation of the state of plasma is provided in the side surface of the vacuum chamber 10 at a position corresponding to a space (plasma generation space) between the substrate stage 12 and the plasma electrode 13 where plasma is generated. An emission intensity observing unit 50 for observing the emission intensity (for example, Si: 288 nm and SiH: 414 nm) of light from Si atoms or SiH molecules in the generated plasma is provided in the optical window 15. The emission intensity observing unit 50 includes an interference filter 51 that selects the emission of light from the Si atoms or the SiH molecules from the emission spectrum of the plasma, and a photomultiplier 52 that converts the light emitted from the Si atoms or the SiH molecules selected by the interference filter 51 into an electric signal. In this example, the interference filter 51 is used to select the emission of light from the Si atoms or the SiH molecules. However, a wavelength may be selected by, for example, a spectroscope. In addition, a photodetector (for example, a photodiode) other than the photomultiplier 52 may be used to detect light.

The thin film forming apparatus further includes a control unit 60 that controls the opening/closing of the gas valve 31 and the operation of the high-frequency power source 40. The control unit 60 supplies a valve opening/closing signal for turning on or off the introduction of the SiH$_4$ gas into the vacuum chamber 10 at a predetermined period to the gas valve 31. The control unit 60 also supplies a power modulation signal to the high-frequency power source 40 so as to modulate the amplitude of the output of high frequency power supplied to the plasma electrode 13 in synchronization with the tuning-on or turning-off of the supply the SiH$_4$.

An emission intensity signal indicating the emission intensity of light from the Si atoms or the SiH molecules observed by the emission intensity observing unit 50 is transmitted to the control unit 60. The control unit 60 calculates the delay time from the output of a valve opening signal toward the gas valve 31 to an actual increase in the light emission intensity of the Si atoms or the SiH molecules. The control unit 60 also calculates the delay time from the output of a valve closing signal toward the gas valve 31 to an actual reduction in the light emission intensity of the Si atoms or the SiH molecules. Thus, the control unit 60 outputs the valve opening/closing signals and the power modulation signal on the basis of the period for which the supply of the SiH$_4$ gas is turned on or off, which is determined considering the delay time.

Next, a method of forming a thin film in the thin film forming apparatus having the above-mentioned structure will be described. First, the substrate 100 is placed on the substrate stage 12 in the vacuum chamber 10, and the vacuum chamber 10 is evacuated through the gas exhaust pipe 11 such that the inside of the vacuum chamber 10 is set to a predetermined degree of vacuum. The heater of the substrate stage 12 heats the substrate 100 to a predetermined temperature. In this state, the gas valve 23a provided on the H$_2$ gas supply pipe 21a is opened to supply a H$_2$ gas from the H$_2$ gas supply port 22a to the vacuum chamber 10 at a predetermined flow rate. In this case, the H$_2$ gas flowing from the H$_2$ gas supply port 22a into the vacuum chamber 10 flows through the cylindrical plasma electrode 13 and is then supplied to the plasma generation space through the gas shower head 132 provided at a bottom part of the plasma electrode 13.

For a SiH$_4$ gas, the gas valve 23b provided on the SiH$_4$ gas supply pipe 21b is opened and then maintained continuously in the opening state, and the air-driven-type gas valve 25 in the shield box 20 is repeatedly opened and closed with a predetermined period so as to rapidly turn on and off the supply of the SiH$_4$ gas into the vacuum chamber 10. Specifically, when the valve opening signal is received from the control unit 60, first, the gas valve 31 is operated to be opened, and compressed air is supplied up to the gas valve 25. The gas valve 25 is opened by the action of air pressure and the SiH$_4$ gas is supplied into the vacuum chamber 10 (plasma generation space) through the gas shower head 132 of the plasma electrode 13. When the valve closing signal is received from the control unit 60, first, the gas valve 31 is operated to be closed and the supply of the compressed air to the gas valve 25 is cut off. When the compressed air is not supplied, the gas valve 25 is closed by the action of air pressure and the supply of the SiH$_4$ gas into the vacuum chamber 10 is cut off.

Figure 2:
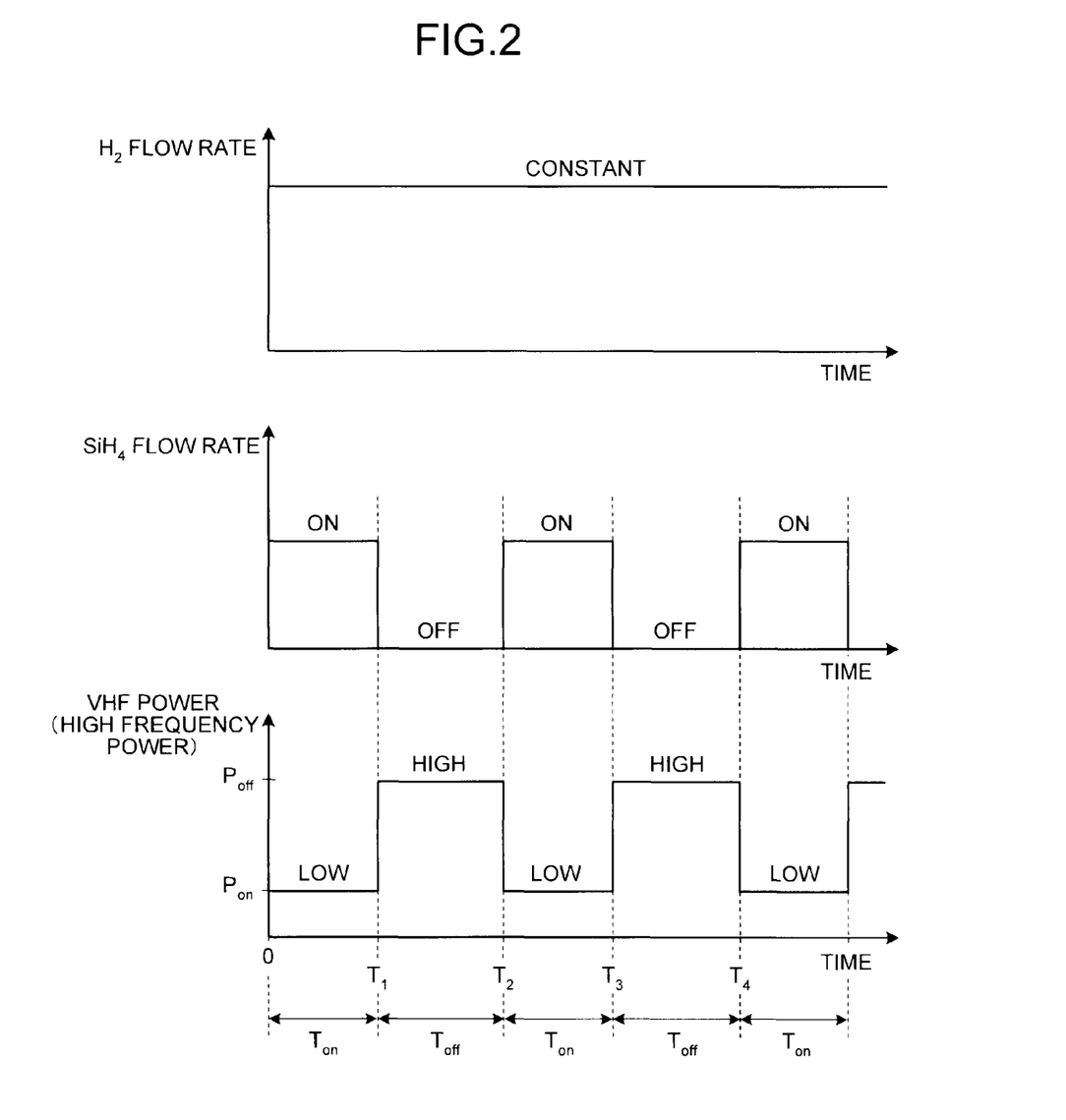
FIG. 2 is a diagram illustrating a variation in the flow rates of a $H_2$ gas and a $SiH_4$ gas and in the high frequency power of a high-frequency power source over time when a thin film is formed.

FIG. 2 is a diagram illustrating a variation in the flow rates of the H$_2$ gas and the SiH$_4$ gas and in the high frequency power of the high-frequency power source over time during the formation of a thin film. As shown in this figure, the H$_2$ gas is supplied into the vacuum chamber 10 at a constant flow rate regardless of the time, but the SiH$_4$ gas is supplied into the vacuum chamber 10 for a period T$_{on}$, but is not supplied into the vacuum chamber 10 for a period T$_{off}$. In addition, the high frequency power is applied at an output level P$_{on}$ to the plasma electrode 13 for the period T$_{on}$, that is, for the period for which the supply of the SiH$_4$ gas is on. The high frequency power is also applied at an output level P$_{off}$ (>P$_{on}$) to the plasma electrode 13 for the period T$_{off}$, that is, for the period for which the supply of the SiH$_4$ gas is off.

The SiH$_4$ gas is easily dissociated by collision with electrons in plasma. When the density of electrons in plasma is too high, a large amount of SiH$_2$, SiH, and Si that collide with gas grains and generate particles is generated in addition to SiH$_3$, which is a precursor of a silicon thin film. This causes the generation of particles in a gas phase. As a result, a defective silicon film with a large number of defects is formed. Therefore, in order to selectively generate preferred SiH$_3$ molecules, it is effective to set the high frequency power to a low level to reduce plasma density when the supply of the SiH$_4$ gas is on. It has been known that the H$_2$ gas is a gaseous species that is less likely to be dissociated. This is because H atoms generated by electron-impact dissociation in plasma is easily recombined in a gas phase, on the wall of the vacuum chamber 10, or on the surface of the electrode and returns to H$_2$ molecules. Therefore, it is necessary to increase the density of electrons in plasma in order to increase the density of the H atoms in plasma.

As described above, it is possible to crystallize an amorphous silicon thin film by exposing the amorphous silicon thin film to H$_2$ plasma. In addition, it has been known that, as the density of H atoms in plasma increases, the time required for crystallization is reduced. Therefore, in order to rapidly crystallize an amorphous silicon film using H$_2$ plasma, it is necessary to increase the density of H atoms in plasma and the high frequency power for generating plasma may be as high as possible. At the time T$_{off}$ (in FIG. 2, T$_1$<t<T$_2$, T$_3$<t<T$_4$, ...) when the supply of the SiH$_4$ gas is off and the surface of the film is crystallized by the H$_2$ plasma, the high frequency power is set to a high level (P$_{on}$<P$_{off}$). For this reason, while a thin film is formed, the flow rate of the SiH$_4$ gas and the output of the high frequency power are controlled as shown in FIG. 2.

For the period T$_{on}$, the SiH$_4$ gas and the H$_2$ gas are supplied into the vacuum chamber 10 and SiH$_4$/H$_2$ mixed plasma with low electron density including a large number of SiH$_3$ molecules is generated by the high frequency power P$_{on}$. An amorphous silicon thin film is formed on the surface of the substrate 100 on the substrate stage 12. Then, when the period T$_{on}$ ends and the period T$_{off}$ starts, only the H$_2$ gas is supplied into the vacuum chamber 10 and H$_2$ plasma with high electron density is generated by the high frequency power P$_{off}$(>P$_{on}$).

The amorphous silicon thin film formed on the substrate 100 is crystallized in a short time.

As such, it is possible to perform switching between the generation of the SiH$_4$/H$_2$ mixed plasma with low electron density that is suitable for the deposition of silicon and the generation of the H$_2$ plasma with high electron density that is suitable for the crystallization of silicon at a high speed. Therefore, even under the deposition conditions (that is, at a high SiH$_4$ flow ratio) of the deposition method according to the related art where the deposition rate is high but an amorphous silicon film is formed, it is possible to form a microcrystalline silicon thin film by adjusting the period T$_{on}$ (=T$_1$=T$_3$-T$_2$= ...) for which the supply of the SiH$_4$ gas is on and the period T$_{off}$ (=T$_2$-T$_1$=T$_4$-T$_3$= ...) for which the supply of the SiH$_4$ gas is off.

However, when the time for which the supply of the SiH$_4$ gas is on or off is relatively short, for example, when T$_{on}$ is shorter than 1 s or T$_{off}$ is shorter than 1 s, it is difficult to modulate the high frequency power in synchronization with the time. Therefore, it is desirable to correctly detect the time delay, which is from the output of the valve opening/closing signal from the control unit 60 toward the gas valve 31 to an actual increase/decrease in the amount of SiH$_4$ gas flowing into the vacuum chamber 10, and determine the timing at which the amplitude of the high frequency power is modulated, considering the time delay.

Figure 3:
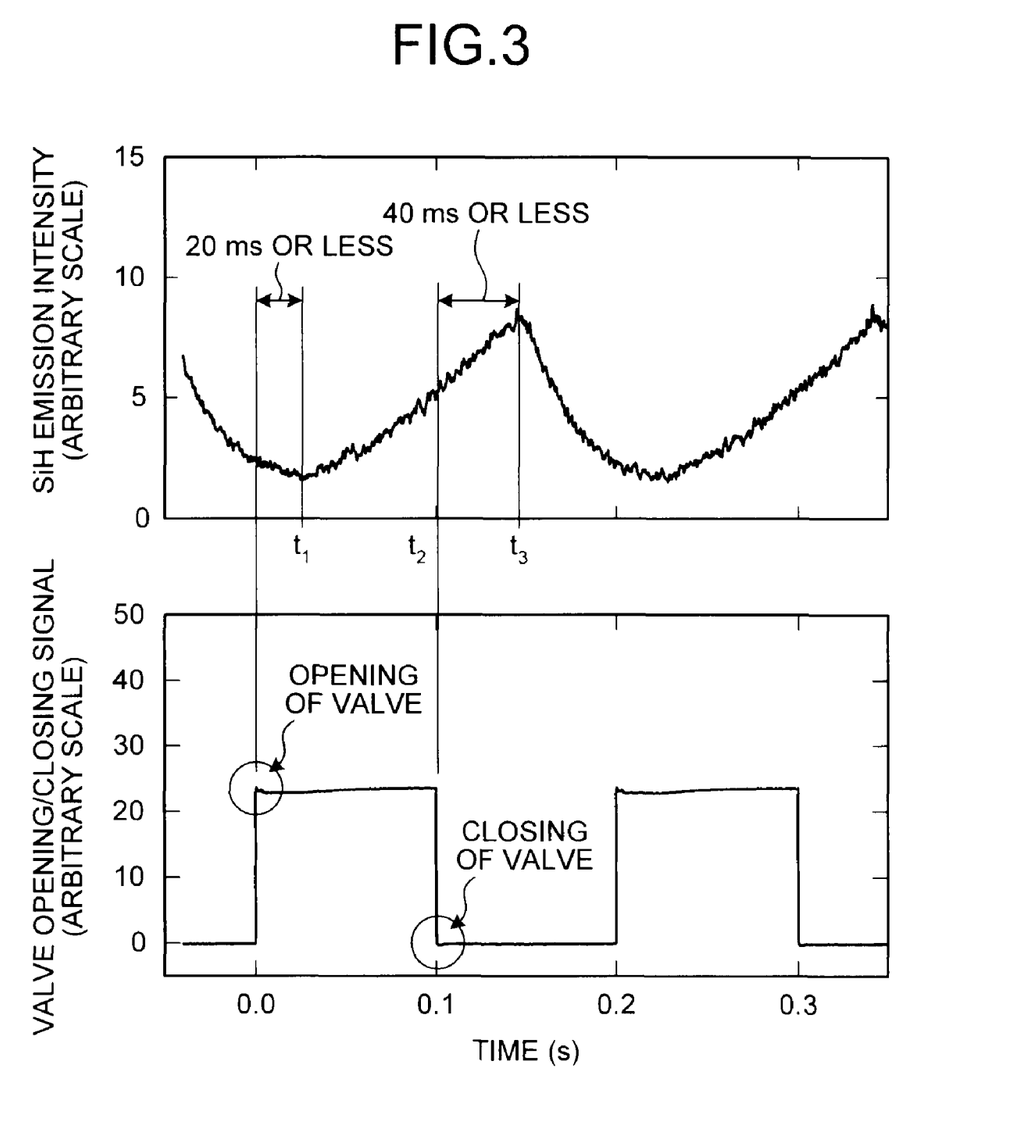
FIG. 3 is a diagram illustrating an example of a relationship between a valve opening/closing signal and a variation in SiH emission intensity in a vacuum chamber over time.

As shown in FIG. 1, the emission intensity observing unit 50 may monitor a variation in the emission intensity of light from the Si atoms or the SiH molecules originating in SiH$_4$ over time. FIG. 3 is a diagram illustrating an example of a relationship between the valve opening/closing signal and a variation in SiH emission intensity in the vacuum chamber over time. In the valve opening/closing signal, the valve opening timing is t=0, a SiH$_4$ gas flow rate is 100 sccm, a H$_2$ gas flow rate is 900 sccm, pressure is 500 Pa, the on time T$_{on}$ of the SiH$_4$ gas is 100 ms, the off time T$_{off}$ of the SiH$_4$ gas is 100 ms, and the high frequency power for generating plasma is constantly 300 W. The H$_2$ gas flow rate is preferably equal to or more than five times the SiH$_4$ gas flow rate, and more preferably, equal to or more than nine times the SiH$_4$ gas flow rate, as in this example. As such, since the H$_2$ gas is continuously supplied, a variation in pressure is small at the on time T$_{on}$ of the SiH$_4$ gas and the off time T$_{off}$ of the SiH$_4$ gas. Therefore, manufacturing of a film is stably performed.

After the valve opening signal is output from the control unit 60 at a time t=0, there is a time delay (=t$_1$), which is from the time t$_1$ when SiH emission intensity starts to increase to the actual inflow of the SiH$_4$ gas into plasma. On the other hand, after the valve closing signal is output from the control unit 60 at a time t=t$_2$, there is a time delay (=t$_3$-t$_2$), which is from the time t$_3$ when SiH emission intensity starts to decrease to the turning-off of the supply of the SiH$_4$ gas. In this example, the SiH$_4$ gas is supplied with a time delay of 20 ms or less from the output of the valve opening signal. On the other hand, the supply of the SiH$_4$ gas is cut off with a time delay of 40 ms or less from the output of the valve closing signal. As such, it is possible to accurately detect the time delay using the monitoring result of the emission intensity observing unit 50. When the on time T$_{on}$ and the off time T$_{off}$ of the SiH$_4$ gas are set to be shorter than the time delay, it is difficult to turn on or off the actual supply of the SiH$_4$ gas into the vacuum chamber 10. As a result, it is difficult to form a microcrystalline silicon thin film. Therefore, in the actual thin film forming process, power modulation timing may be determined on the basis of the time delay such that a microcrystalline silicon thin film can be formed. The time delay is calculated for each deposition condition in advance, and a time delay corresponding to the deposition conditions is used to determine the amplitude modulation time of the high frequency power during deposition.

After the microcrystalline silicon thin film with a predetermined thickness is formed in this way, the gas valve 23a provided on the H$_2$ gas supply pipe 21a and the gas valve 23b provided on the SiH$_4$ gas supply pipe 21b are closed, and the heater of the substrate stage 12 is turned off. The vacuum chamber 10 is sufficiently evacuated. Then, the internal pressure of the vacuum chamber 10 returns to atmospheric pressure, and the substrate 100 on the substrate stage 12 is carried out of the vacuum chamber 10. In this way, the thin film forming process ends.

Finally, the evaluation result of the thin film formed by the thin film forming method will be described. Here, a silicon thin film is formed under the following conditions: a SiH$_4$ gas flow rate is 100 sccm; a H$_2$ gas flow rate is 900 sccm (that is, the SiH$_4$ gas flow ratio=10%); pressure is 500 Pa; the on time $T_{on}$ of the SiH$_4$ gas is 100 ms; the off time $T_{off}$ of the SiH$_4$ gas is 100 ms (that is, a frequency is 5 Hz and a duty ratio is 50%); when the supply of the SiH$_4$ gas is on, the high frequency power (frequency: 60 MHz) $P_{on}$ for generating plasma is 100 W; when the supply of the SiH$_4$ gas is off, the high frequency power $P_{off}$ is 500 W; the distance between the plasma electrode 13 and the substrate 100 is 10 mm; and the temperature of the substrate stage 12 is set to 200° C. In this case, the total deposition time for which the high frequency power is supplied is 5 minutes.

When the silicon thin film was formed under these conditions, a deposition rate of 8.1 nm/s was obtained, and it was possible to perform practical high-speed deposition. In addition, the peak intensity ratio $I_c/I_a$ of the peak $I_c$ of the crystalline silicon thin film at 520 cm$^{-1}$ to the peak $I_a$ of the amorphous silicon thin film at 480 cm$^{-1}$ measured by Raman spectroscopy was 7.2. The peak intensity ratio $I_c/I_a$ indicates the degree of crystallization in the silicon thin film. If the peak intensity ratio $I_c/I_a$ is equal to or more than 5 and equal to or less than 10, the film has sufficient crystallization efficiency for use in a solar cell. Therefore, the microcrystalline silicon thin film formed by the thin film forming method according to the first embodiment has a property that enables the thin film to be used for a solar cell with high photoelectric conversion efficiency.

According to the first embodiment, while a film is formed by a plasma CVD method, the H$_2$ gas is supplied into the vacuum chamber 10 at a constant flow rate, the SiH$_4$ gas is supplied in a manner such that the supply of the SiH$_4$ gas is rapidly turned on or off with a predetermined period, and the high frequency power whose amplitude is modulated in synchronization with the turning-on or turning-off of the supply of the SiH$_4$ gas is supplied. Therefore, while the SiH$_4$ gas is supplied, an amorphous silicon thin film is formed on the substrate 100 at a high speed, and the amorphous silicon thin film is crystallized at a high speed during the period for which the SiH$_4$ gas is not supplied. This process may be repeatedly performed to form a high-quality microcrystalline silicon thin film at a high speed, as compared with the method of forming a microcrystalline silicon thin film according to the related art.

The deposition rate in the plasma CVD method according to the related art was about 1 nm/s or less, but the deposition rate in the thin film forming method according to the first embodiment was about 8.1 nm/s. Therefore, it is possible to improve the throughput of a process of manufacturing a photoelectric conversion device, such as a solar cell, using the microcrystalline silicon thin film as a photoelectric conversion layer. In addition, the time required to manufacture the microcrystalline silicon thin film according to the first embodiment is equal to or less than about one eighth of the time required to manufacture the microcrystalline silicon thin film according to the related art. Therefore, it is possible to reduce power required to form the microcrystalline silicon thin film and thus reduce power consumption.

In the thin film forming method according to the first embodiment, when a microcrystalline silicon film is formed on a relatively small substrate (for example, a substrate with a size of 10 cm×10 cm), it is possible to form the microcrystalline silicon film with a uniform thickness in an error range of ±10% in the plane of the substrate.

In the above-mentioned example, parameters, such as a gas flow rate, pressure, and power are fixed. However, the deposition conditions of the microcrystalline silicon film are not limited thereto. The on time $T_{on}$ of the SiH$_4$ gas is 100 ms and the off time $T_{off}$ thereof is 100 ms. However, the same experiment as described above was performed while changing $T_{on}$ and $T_{off}$, and the result of the experiment proved that it was preferable to stop the supply of gas at the time when an atom to several silicon layers were formed on the substrate after the supply of the SiH$_4$ gas started. The detailed setting of the $T_{on}$ or $T_{off}$ time depends on the deposition rate. However, it is possible to obtain the same effect as that in the above-mentioned example under the conditions of a gas supply time in a wide range of 10 ms$\leq T_{on} \leq$1 s and an off time in a wide range of 10 ms$\leq T_{off} \leq$1 s when a film is formed at a high speed.

In the method of manufacturing the microcrystalline silicon film according to the first embodiment, H$_2$ is used as a crystallization acceleration gas and SiH$_4$ is used as a material gas. However, an inert gas, such as He, Ne, or Ar, may be added to the H$_2$ gas. For example, the gas preferably includes 50 vol % or more of H$_2$ as a main component, and more preferably, 80% or more of H$_2$. In addition, the material gas is not limited to SiH$_4$. The material gas may be gas including Si, for example, group-IV hydride, such as Si$_2$H$_6$, and a dopant gas whose representative examples are diborane (B$_2$H$_6$), phosphine (PH$_3$), and arsine (AsH$_3$) may be added to the material gas.

When a microcrystalline silicon germanium (Si$_x$Ge$_{1-x}$) film other than the microcrystalline silicon film is formed, the same effect as described above is obtained, and it is possible to form the film at a high speed while maintaining high crystallinity. In this case, a mixed gas of SiH$_4$ and GeH$_4$ may be used as the material gas. In addition, the emission intensity observing unit 50 may observe light emitted from Si or SiH, or Ge or GeH in plasma.

Second Embodiment

In the thin film forming apparatus and the thin film forming method according to the first embodiment, when the microcrystalline silicon thin film is formed on the substrate 100 with a relatively small size (for example, a substrate with a size of 10 cm×10 cm), as shown in FIG. 1, it is possible to form a film with a uniform thickness (the uniformity of the thickness of the film in the plane of the substrate is within ±10%) using one air-driven-type gas valve 25 that turns on or off the supply of the SiH$_4$ gas into the vacuum chamber 10. In addition, it is possible to form a film at a SiH$_4$ gas flow rate of 100 sccm and a deposition rate of 8.1 nm/s.

However, when a film is formed on a large substrate with a size of, for example, 1.4 m×1.1 m by the apparatus having the above-mentioned structure, the uniformity of the thickness of the film in the plane of the substrate or the crystallinity of the film deteriorates up to ±40%. It is considered that this is because the microcrystalline silicon thin film is thick in the vicinity of the center of the plane, at which the gas valve 25 which supplies the $SiH_4$ gas is positioned, but the thickness of the microcrystalline silicon thin film significantly decreases toward the periphery of the substrate, which causes spatial nonuniformity in the supply of the $SiH_4$ gas into the plasma generation space between the plasma electrode 13 and the substrate stage 12.

In the second embodiment, a thin film forming apparatus and a thin film forming method capable of uniformly forming a microcrystalline silicon thin film on a large meter-size substrate at a high speed will be described.

Figure 4:
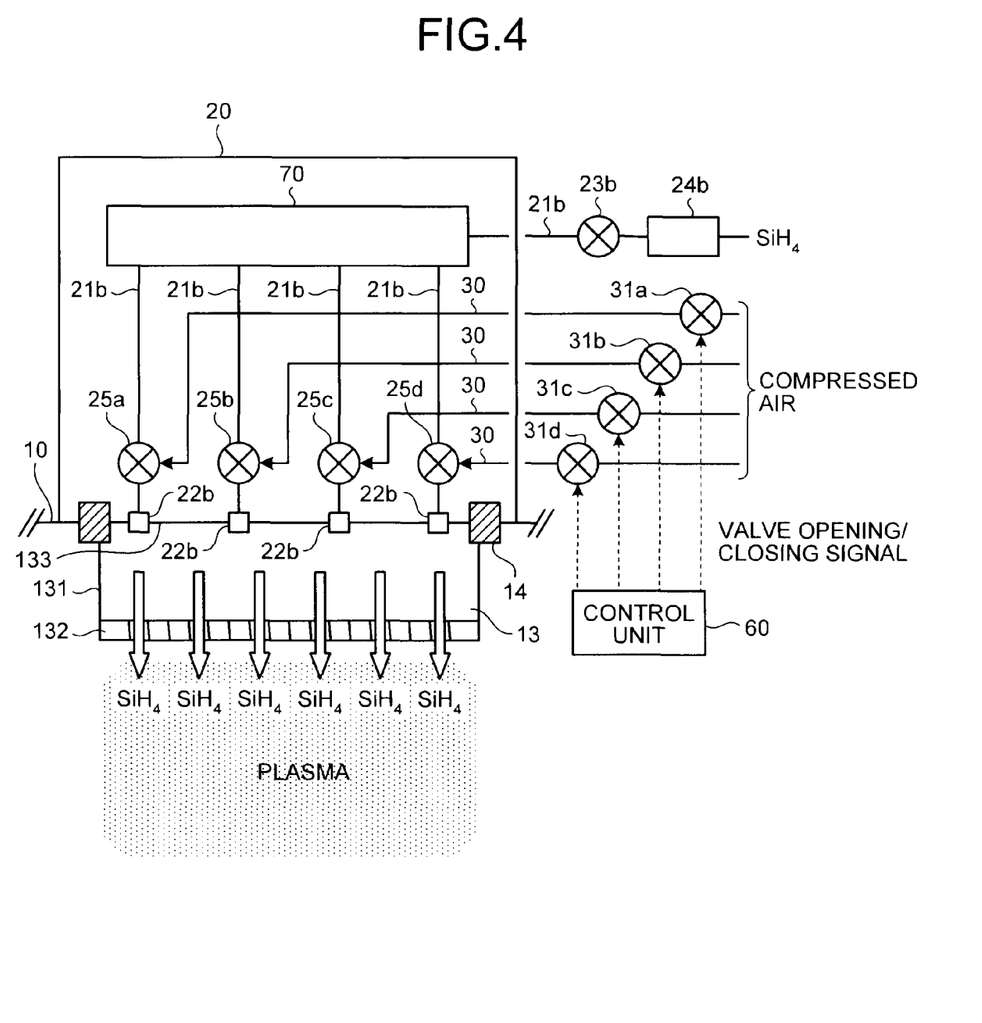
FIG. 4 is a diagram schematically illustrating an example of a structure of a thin film forming apparatus according to a second embodiment of the invention.

FIG. 4 is a diagram schematically illustrating a structure of the vicinity of a $SiH_4$ gas supply portion of the thin film forming apparatus according to the second embodiment of the invention. The second embodiment is different from the first embodiment in a method of supplying the $SiH_4$ gas to the plasma electrode 13. Therefore, FIG. 4 shows only the method of supplying the $SiH_4$ gas. In addition, a $H_2$ gas supply and introducing portion, such as the $H_2$ gas supply pipe 21a, a high-frequency power generating and supply portion, such as the high frequency power source 40, and the emission intensity observing unit 50 have the same structure as those in the first embodiment, and thus illustration and description thereof will not be repeated.

For supplying a $H_2$ gas and a $SiH_4$ gas, one $H_2$ gas supply port (not shown) and a plurality of (in the second embodiment, four) $SiH_4$ gas supply ports 22b, which are suited to the size of a substrate on which a thin film is formed, are separately provided on an upper surface portion 133 of a plasma electrode 13. $SiH_4$ gas supply pipes 21b that supply the $SiH_4$ gas are connected to the $SiH_4$ gas supply ports 22b, and a mass flow controller 24b that controls the flow rate of the $SiH_4$ gas from a $SiH_4$ gas supply portion (not shown) for supplying the $SiH_4$ gas, and an air-driven-type or electromagnetic gas valve 23b that turns on or off the flow of the $SiH_4$ are provided on the $SiH_4$ gas supply pipe 21b outside a shield box 20.

Inside the shield box 20, the $SiH_4$ gas supply pipes 21b are connected to a gas storage tank 70 capable of storing a predetermined amount of $SiH_4$ gas, and respective four $SiH_4$ gas supply pipes 21b branched off from the gas storage tank 70 are connected to the $SiH_4$ gas supply ports 22b via air-driven-type gas valves 25a to 25d that turn on or off the supply of the $SiH_4$ gas to the plasma electrode 13. The gas storage tank 70 has a space capable of storing at least some amount of $SiH_4$ gas supplied each time the gas valves 25a to 25d are changed from an on state to an off state. In addition, the lengths of the $SiH_4$ gas supply pipes 21b between the gas storage tank 70 and the gas valves 25a to 25d, which turn on or off the supply of the $SiH_4$ gas to the plasma electrode 13, are equal to each other. The gas valves 25a to 25d that turn on or off the supply of the $SiH_4$ gas are directly connected to the $SiH_4$ gas supply ports 22b in order to maximize the switching speed between the supply of the $SiH_4$ gas and the cutting-off of the supply of the $SiH_4$ gas. In addition, the four $SiH_4$ gas supply ports 22b are regularly arranged in the plane of the plasma electrode 13.

The gas valves 25a to 25d are an air driven type, and four air supply pipes 30 for supplying compressed air to the gas valves 25a to 25d are provided. Electromagnetic gas valves 31a to 31d that turn on or off the supply of the compressed air are provided to the air supply pipes 30 outside the shield box 20.

The control unit 60 adjusts the timing of valve opening/closing signals supplied to the gas valves 31a to 31d such that the amounts of $SiH_4$ gas supplied to the plasma electrode 13 through the $SiH_4$ gas supply pipes 21b are increased or decreased at the same ratio after the gas valves 25a to 25d of the $SiH_4$ gas supply pipes 21b are turned on or off. As such, the timing of the valve opening/closing signal is adjusted to reduce a variation in the amount of $SiH_4$ gas supplied from each of the $SiH_4$ gas supply pipes 21b over time, thereby reducing nonuniformity in an in-plane distribution during deposition. In addition, the control unit 60 modulates the amplitude of the high frequency power applied to the plasma electrode 13 in synchronization with an increase or decrease in the amount of $SiH_4$ gas supplied into the vacuum chamber 10.

Next, a method of supplying the $SiH_4$ gas in the thin film forming apparatus will be described. When the $SiH_4$ gas is supplied, the gas valve 23b provided on the $SiH_4$ gas supply pipe 21b is opened and then maintained in an opened state, and the four gas valves 25a to 25d in the shield box 20 are repeatedly opened and closed with a predetermined period to turn on and off the supply of the $SiH_4$ gas into the vacuum chamber 10 at a high speed. Specifically, when a signal is received from the control unit 60, first, the gas valves 31a to 31d on the air supply pipes 30 are opened or closed to turn on or off the supply of the compressed air to the gas valves 25a to 25d, respectively.

For example, when a valve opening signal is output from the control unit 60 and the gas valves 31a to 31d are turned on (opened), the compressed air is supplied to the gas valves 25a to 25d that turn on or off the supply of the $SiH_4$ gas, and the gas valves 25a to 25d are turned on (opened). Then, the $SiH_4$ gas stored in the gas storage tank 70 is supplied to the plasma electrode 13 through the $SiH_4$ gas supply pipes 21b and the $SiH_4$ gas supply ports 22b, and is then supplied to a plasma generation space through the gas shower head 132. The times from the turning-on of the gas valves 25a to 25d to the arrival of the $SiH_4$ gas to the gas supply ports 22b are generally different from each other since there is a difference in response speed or operation speed between the gas valves 25a to 25d. Therefore, the control unit 60 makes the transmission timings of the valve opening signals to the gas valves 31a to 31d different from each other such that the $SiH_4$ gas is simultaneously supplied to all of the $SiH_4$ gas supply ports 22b.

On the other hand, when a valve closing signal is output from the control unit 60 and the gas valves 31a to 31d on the gas supply pipes 30 are turned off (closed), the supply of the compressed air to the gas valves 25a to 25d that turn on or off the supply of the $SiH_4$ gas is cut off and the gas valves 25a to 25d are turned off (closed) by the action of the air pressure. Then, the supply of the $SiH_4$ gas from the gas storage tank 70 to the plasma electrode 13 through the $SiH_4$ gas supply pipes 21b is cut off. In this case, the times from the turning-off of the gas valves 25a to 25d to a reduction in the amount of $SiH_4$ gas from the $SiH_4$ gas supply ports 22b are generally different from each other since there is a difference in response speed or operation speed between the gas valves 25a to 25d. Therefore, the control unit 60 makes the transmission timings of the valve opening signals to the gas valves 31a to 31d different from each other such that the amount of $SiH_4$ gas is simultaneously reduced in all of the $SiH_4$ gas supply ports 22b.

As such, in the second embodiment, the $SiH_4$ gas is supplied to the large shower head 132 through a plurality of $SiH_4$ gas supply pipes 21b and a plurality of gas valves 25a to 25d. Therefore, even when a large shower head 132 is used to form a large meter-size substrate, it is possible to uniformly supply the $SiH_4$ gas to the plasma generation space.

In the second embodiment, since the gas storage tank 70 is provided in the middle of the $SiH_4$ gas supply pipes 21b, it is possible to store a large amount of $SiH_4$ gas in the gas storage tank 70 during the period for which the gas valves 25a to 25d are turned off. Therefore, it is possible to supply a large amount of SiH$_4$ gas to the shower head 132 after the gas valves 25a to 25d are turned on. Even when a film is formed on a large meter-size substrate at a high speed, that is, even when a large amount of SiH$_4$ gas is supplied, it is possible to repeat a process of supplying a large amount of SiH$_4$ gas since the gas storage tank 70 is provided.

However, when the time required to turn on or off the supply of the SiH$_4$ gas is relatively short, for example, when T$_{on}$ is shorter than 1 s or T$_{off}$ is shorter than 1 s, it is difficult to make the supply timing of the SiH$_4$ gas equal to each other at a plurality of different points. Therefore, in the second embodiment (when there are four gas supply points), it is preferable to correctly detect a variation in the time delay, which is from the simultaneous output of the valve opening/closing signals from the control unit 60 to the gas valves 31a to 31d to an actual increase/decrease in the amount of SiH$_4$ gas flowing from the gas valves 25a to 25d into the vacuum chamber 10 after the gas valves 25a to 25d on the SiH$_4$ gas supply pipe 21b are turned on or off. Furthermore, it is preferable to determine the timing of turning on or off the gas valves 31a to 31d for the compressed air, considering the variation in the delay time.

As shown in FIG. 1, the emission intensity observing unit 50 monitors a variation in the emission intensity of light from the Si atoms or the SiH molecules originating in SiH$_4$ over time. Next, the monitoring method will be described.

For example, a H$_2$ gas is supplied into the vacuum chamber 10 at a predetermined constant flow rate and pressure is controlled to be a predetermined value. Then, high frequency power is supplied to at a predetermined level to generate H$_2$ plasma. In this state, the control unit 60 outputs the valve opening signal to turn on the gas valve 31a for the compressed air and turn on only the gas valve 25a of the SiH$_4$ gas supply pipe 21b. Immediately after the SiH$_4$ gas flows into the H$_2$ plasma, light is emitted from the Si atoms or the SiH molecules. Therefore, the time difference from when the valve opening signal is output to when the emission intensity of Si or SiH increases is measured and recorded. In addition, the time difference from when the valve closing signal is output from the control unit 60 to when the emission intensity of Si or SiH in the plasma increases is measured and recorded.

Then, the control unit 60 generates a valve opening signal (or a valve closing signal) for compressed air to turn on (or off) the gas valve 31b for compressed air, and measures and records the time difference from when the gas valve 25b of the SiH$_4$ gas supply pipe 21b is turned on (or off) to when the emission intensity of Si or SiH increases (or decreases). As such, the time differences are measured and recorded for all of the gas valves 25a to 25d provided in the SiH$_4$ gas supply pipes 21b by the same method as described above. Then, a variation in the time difference is corrected, and the control unit 60 outputs the valve opening/closing signals to the gas valves 31a to 31d for compressed air such that the SiH$_4$ gas is supplied to the plasma (or the supply of the SiH$_4$ gas is cut off) at the same timing. In addition, the control unit 60 performs control such that the SiH$_4$ gas introduced from the SiH$_4$ gas supply pipes 21b into the vacuum chamber 10 increases or decreases at the same timing. Therefore, the control unit 60 can modulate the amplitude of the high frequency power applied to the plasma electrode 13 in synchronization with the increase or decrease in the amount of SiH$_4$ gas flowing into the vacuum chamber 10.

Finally, an example of the evaluation of a microcrystalline silicon thin film formed on a large glass substrate with a size of 1.4 m×1.1 m by the above-mentioned method will be described. Here, a silicon thin film is formed under the following conditions: a SiH$_4$ gas flow rate is 5 slm; a H$_2$ gas flow rate is 95 slm (that is, SiH$_4$ gas flow ratio=5%); pressure is 1000 Pa; the on time T$_{on}$ of the SiH$_4$ gas is 20 ms; the off time T$_{off}$ of the SiH$_4$ gas is 80 ms (that is, a frequency is 10 Hz and a duty ratio is 20%); when the supply of the SiH$_4$ gas is on, the high frequency power (frequency: 27.12 MHz) P$_{on}$ for generating plasma is 1 kW; when the supply of the SiH$_4$ gas is off, the high frequency power P$_{off}$ is 30 kW; the distance between the plasma electrode 13 and the substrate is 5 mm; and the temperature of the substrate stage 12 is set to 200° C. In this case, the total deposition time for which the high frequency power is supplied is 5 minutes.

When deposition of the silicon thin film was performed under these conditions, a deposition rate of 4.2 nm/s was obtained, and uniformity in the plane of the substrate with a size of 1.4 m×1.1 m was ±8%. Therefore, it was possible to practically form a film with a uniform thickness on a large meter-size substrate at a high speed. In addition, a crystallization ratio calculated by Raman spectroscopy, that is, the peak intensity ratio I$_c$/I$_a$ of the peak I$_c$ of the crystalline silicon thin film at 520 cm$^{-1}$ to the peak I$_a$ of the amorphous silicon thin film at 480 cm$^{-1}$ was in the range of from 7.9 to 8.3 at a plurality of points in the plane of the substrate. Therefore, it was possible to uniformly form a microcrystalline silicon thin film having a property that enables the film to be used for a solar cell.

According to the second embodiment, a plurality of SiH$_4$ gas supply ports 22b for supplying the SiH$_4$ gas to the shower head is equally provided in the plane of the plasma electrode 13, and the gas storage tank 70 which stores the SiH$_4$ gas is provided between the SiH$_4$ gas supply ports 22b and the SiH$_4$ gas supply portion. In addition, the gas storage tank 70 is connected to the SiH$_4$ gas supply ports 22b by the SiH$_4$ gas supply pipes 21a, and the air-driven-type gas valves 25a to 25d are provided on the SiH$_4$ gas supply pipes 21a at the same distance from the gas storage tank 70. The control unit 60 outputs signals for controlling the turning-on or turning-off of the gas valves 25a to 25d according to a variation in the time delay from the turning-on or turning-off of the gas valves 25a to 25d to an actual increase or decrease in the amount of SiH$_4$ gas flowing into the vacuum chamber 10. In this way, it is possible to form a microcrystalline silicon film with a uniform thickness on the surface of a large meter-size substrate at a high speed even under the conditions of a high SiH$_4$ flow rate where only an amorphous silicon thin film is obtained by the method according to the related art. As a result, it is possible to further improve productivity in manufacturing of a solar cell using the microcrystalline silicon thin film as a photoelectric conversion layer or reduce manufacturing costs.

INDUSTRIAL APPLICABILITY

As described above, the thin film forming method according to the invention is useful to manufacture a solar cell using a microcrystalline silicon thin film as a photoelectric conversion layer. In addition, the thin film forming method according to the invention is useful to manufacture a solar cell using a microcrystalline silicon thin film formed using a large meter-size substrate.

| EXPLANATIONS OF LETTERS OR NUMERALS | |
| --- | --- |
| 10 | Vacuum chamber |
| 11 | Gas exhaust pipe |
| 12 | Substrate stage |

-continued

| EXPLANATIONS OF LETTERS OR NUMERALS | |
|---|---|
| 13 | Plasma electrode |
| 14 | Insulating spacer |
| 15 | Optical window |
| 20 | Shield box |
| 21a, 21b | Gas supply pipe |
| 22a, 22b | Gas supply port |
| 23a, 23b, 25a to 25d, 31a to 31d | Gas valve |
| 24a, 24b | Mass flow controller |
| 30 | Air supply pipe |
| 40 | High frequency power source |
| 50 | Emission intensity observing unit |
| 51 | Interference filter |
| 52 | Photomultiplier |
| 60 | Control unit |
| 70 | Gas storage tank |
| 100 | Substrate |
| 131 | Side surface portion |
| 132 | Gas shower head |
| 133 | Upper surface portion |

The invention claimed is:

1. A method of manufacturing a semiconductor film, comprising:
a substrate holding step of holding a substrate so as to face a plasma electrode in a vacuum chamber of a thin film forming apparatus including the vacuum chamber having the plasma electrode and a shield box that is connected to a ground so as to surround the plasma electrode outside the vacuum chamber; and
a microcrystalline semiconductor film forming step of intermittently supplying a material gas containing at least one of silicon and germanium while continuously supplying a gas containing hydrogen as a main component to the vacuum chamber, and applying different levels of high frequency power to the plasma electrode during a period for which the material gas is supplied and during a period for which the material gas is not supplied in order to generate plasma in a plasma generation space between the plasma electrode and the substrate, thereby forming a microcrystalline semiconductor film,
wherein, in the microcrystalline semiconductor film forming step, a valve provided in the shield box is periodically opened or closed to supply the material gas from a shower head that is provided so as to face the substrate.

2. The method of manufacturing a semiconductor film according to claim 1,
wherein, in the microcrystalline semiconductor film forming step, a time required to intermittently supply the material gas to the plasma generation space is equal to or more than 10 ms and equal to or less than 1 s.

3. The method of manufacturing a semiconductor film according to claim 1, further comprising:
a deviation detecting step of calculating a deviation between output timing of an instruction to open or close the valve and on or off timing of the supply of the material gas to the plasma generation space, before the microcrystalline semiconductor film forming step,
wherein, in the microcrystalline semiconductor film forming step, a time difference is set between intensity modulation timing of the high frequency power supplied to the plasma electrode and the output timing of the instruction to open or close the valve on the basis of the deviation.

4. The method of manufacturing a semiconductor film according to claim 3,
wherein a plurality of material gas supply paths is connected to the vacuum chamber via valves in the shield box, and
in the microcrystalline semiconductor film forming step, opening or closing timing of the valve in each of the material gas supply paths is individually adjusted with respect to intensity modulation timing of the high frequency power supplied to the plasma electrode, on the basis of the deviation of each of the material gas supply paths calculated in the deviation detecting step.

5. A method of manufacturing a semiconductor film, comprising:
a substrate holding step of holding a substrate so as to face a plasma electrode in a vacuum chamber that has the plasma electrode; and
a microcrystalline semiconductor film forming step of intermittently supplying a material gas containing at least one of silicon and germanium while continuously supplying a gas containing hydrogen as a main component to the vacuum chamber, and applying different levels of high frequency power to the plasma electrode during a period for which the material gas is supplied and during a period for which the material gas is not supplied in order to generate plasma in a plasma generation space between the plasma electrode and the substrate, thereby forming a microcrystalline semiconductor film,
wherein, in the microcrystalline semiconductor film forming step, a valve is periodically opened or closed to intermittently supply the material gas for a predetermined time period into the plasma generation space from a shower head that is provided so as to face the substrate, the predetermined time period being 10 ms or more and 1 s or less.

6. The method of manufacturing a semiconductor film according to claim 5, further comprising:
a deviation detecting step of calculating a deviation between output timing of an instruction to open or close the valve and on or off timing of the supply of the material gas to the plasma generation space, before the microcrystalline semiconductor film forming step,
wherein, in the microcrystalline semiconductor film forming step, a time difference is set between intensity modulation timing of the high frequency power supplied to the plasma electrode and the output timing of the instruction to open or close the valve on the basis of the deviation.

* * * * *